(12) United States Patent
Meltaus et al.

(10) Patent No.: US 9,219,466 B2
(45) Date of Patent: Dec. 22, 2015

(54) LATERALLY COUPLED BULK ACOUSTIC WAVE FILTER WITH IMPROVED PASSBAND CHARACTERISTICS

(71) Applicant: Teknologian tutkimuskeskus VTT, VTT (FI)

(72) Inventors: Johanna Meltaus, Espoo (FI); Tuomas Pensala, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 38 days.

(21) Appl. No.: 14/357,220

(22) PCT Filed: Nov. 9, 2012

(86) PCT No.: PCT/FI2012/051096
§ 371 (c)(1),
(2) Date: May 9, 2014

(87) PCT Pub. No.: WO2013/068652
PCT Pub. Date: May 16, 2013

(65) Prior Publication Data
US 2014/0312994 A1 Oct. 23, 2014

Related U.S. Application Data

(60) Provisional application No. 61/558,445, filed on Nov. 11, 2011.

(30) Foreign Application Priority Data

Nov. 11, 2011 (FI) ...................................... 20116113

(51) Int. Cl.
H03H 9/15 (2006.01)
H03H 9/54 (2006.01)
H03H 9/56 (2006.01)

(52) U.S. Cl.
CPC ........ *H03H 9/54* (2013.01); *H03H 9/564* (2013.01)

(58) Field of Classification Search
CPC ... H03H 9/02062; H03H 9/02157; H03H 9/175
USPC .................................................. 333/187–192
See application file for complete search history.

(56) References Cited

U.S. PATENT DOCUMENTS 6,107,721 A * 8/2000 Lakin ............................ 310/321
6,448,695 B2 * 9/2002 Milsom ......................... 310/334
(Continued)

FOREIGN PATENT DOCUMENTS

EP  1575165 A1  9/2005
WO  WO 2006126168 A1  11/2006
(Continued)

OTHER PUBLICATIONS

Meltaus J. et al. "Laterally coupled BAW filters with 5% bandwidth", 2010 IEEE Ultrasonic Symposium (IUS), San Diego, USA, Oct. 11-14, 2010, pp. 966-969, ISBN 978145770382-9, doi:10.1109/ULTSYM.2010.5935612, EPOQUENET NPL XP031952748.

*Primary Examiner* — Dean Takaoka
(74) *Attorney, Agent, or Firm* — Seppo Laine Oy

(57) ABSTRACT

The invention relates to a laterally coupled bulk acoustic wave (LBAW) filter comprising a vibration layer for carrying bulk acoustic waves, electrode means comprising a first electrode coupled to the vibration layer for exciting to the vibration layer at least one longitudinal wave mode having a first frequency band and one shear wave mode having a second frequency band, and a second electrode coupled to the vibration layer for sensing the filter pass signal, the first and second electrodes being laterally arranged with respect to each other, and an acoustic reflector structure in acoustic connection with the vibration layer. According to the invention, the reflector structure is adapted to acoustically isolate the vibration layer from its surroundings at the first frequency band more efficiently than at the second frequency band for suppressing the effect of the shear wave mode at the second frequency band from the filter pass signal. The invention helps to improve the quality of LBAW filter passbands.

19 Claims, 10 Drawing Sheets

(56) References Cited

U.S. PATENT DOCUMENTS

| | | |
|---|---|---|
| 6,933,807 B2 | 8/2005 | Marksteiner et al. |
| 7,439,824 B2 * | 10/2008 | Aigner et al. ............... 333/187 |
| 7,474,174 B2 * | 1/2009 | Milsom et al. ............... 333/189 |
| 2005/0200433 A1 | 9/2005 | Aigner et al. |
| 2008/0204857 A1 | 8/2008 | Godshalk et al. |
| 2009/0142480 A1 | 6/2009 | Godshalk et al. |
| 2009/0153268 A1 * | 6/2009 | Milsom et al. ............... 333/189 |
| 2013/0278356 A1 * | 10/2013 | Meltaus et al. ............... 333/187 |

FOREIGN PATENT DOCUMENTS

| | | |
|---|---|---|
| WO | WO 2007060557 A1 | 5/2007 |
| WO | WO 2011131844 A1 | 10/2011 |

* cited by examiner

LATERALLY COUPLED BULK ACOUSTIC WAVE FILTER WITH IMPROVED PASSBAND CHARACTERISTICS

FIELD OF THE INVENTION

The invention relates to bulk acoustic wave (BAW) thin-film technology. In particular, the invention relates to a laterally coupled BAW (LBAW) filter and a method of filtering an RF signal with the aid of an LBAW filter. Such filters have the features of the preamble of claim 1.

BACKGROUND OF THE INVENTION

BAW Resonators

Bulk acoustic wave thin-film devices can be used as resonators. A schematic picture of a solidly-mounted piezoelectric BAW resonator based on thin-film technology is shown in FIG. 1. The piezoelectric thin-film layer and electrode layers that constitute the resonator transform the electric signal into acoustic vibration and vice versa. The resonator is solidly-mounted on the silicon substrate, meaning that the resonator is acoustically isolated from the substrate with an acoustic reflector consisting of alternating layers of high and low acoustic impedance (Z) materials (acoustic Bragg reflector, or "acoustic mirror"). This type of resonator is often referred to as solidly mounted resonator (SMR). Another possibility would be to fabricate a self-standing membrane of the resonator, usually referred to as a membrane resonator or FBAR.

In BAW devices, the propagation direction of the bulk wave is typically along the thickness axis (z axis in FIG. 1). Particle displacement is either perpendicular to the propagation direction (shear wave) or parallel to the propagation direction (longitudinal wave). In the thickness direction, the acoustic wave has acoustic wavelength $\lambda_z$. The bulk acoustic wave reflects between the electrodes, and a standing wave (thickness resonance) arises when the thickness d of the piezoelectric layer and the electrodes is such that an integer multiple N of acoustic half-wavelengths is accommodated within the thickness formed by the piezolayer and the electrode layers: $d_{piezo+els} = N\lambda_z/2$. Thickness modes are characterized based on the integer number N and the direction of the particle motion. FIG. 2 illustrates two bulk wave modes: the first-order thickness-extensional (TE1) mode (top) and the second-order thickness-shear (TS2) mode (bottom). In the TE1 mode, the particle displacement is parallel to the propagation direction (thickness direction) and there is one half-wavelength ($\lambda_z/2$) within the thickness of the piezoelectric layer and the electrodes. In the TS2 mode, the particle displacement is perpendicular to the propagation direction and there is one wavelength ($\lambda_z$) within the thickness of the piezoelectric layer and the electrodes.

The wave can also propagate in the lateral direction as a plate wave with a lateral wavelength $\lambda_\parallel$. In FIG. 2, this is illustrated for the TE1 and TS2 modes. In a laterally finite-sized resonator, standing wave modes can arise in the lateral direction due to reflections from resonator edges.

Acoustic properties of a resonator can be described with dispersion diagrams, i.e., a diagram showing the lateral wave number $k_\parallel = 2\pi/\lambda_\parallel$ of a bulk resonance mode vs. frequency f, see FIG. 3 for an example of calculated dispersion diagram of a BAW resonator layer stack. Dispersion properties of a BAW resonator are mainly determined by the thin-film layer stack. In FIG. 3, the onset frequencies (the frequency at which the vibration mode first appears) of the second-order thickness-shear TS2 vibration mode and the TE1 vibration mode are shown. For the TE1 mode, the onset frequency is the same as the frequency for which the lateral wave number $k_\parallel = 0$. The fundamental thickness resonance is close to k=0 (lateral wavelength is infinite). The dispersion curve describes the properties of the laterally propagating waves (plate waves) with frequency. Dispersion is said to be Type 1 if the TS2 mode appear at lower frequency than the TE1 mode, and Type 2 in the opposite case.

BAW Filters

A filter can be made by electrically connecting one-port resonators to form a ladder or a lattice filter. Another possibility is to arrange mechanical (acoustic) coupling between resonators by placing them close enough to each other for the acoustic wave to couple from one resonator to another. Such devices are called coupled resonator filters (CRF). In BAW devices, vertical acoustic coupling between stacked piezoelectric layers is used in stacked crystal filters (SCF, see R. M. Lakin, et al, "*Thin film resonator technology*", in Proc. IEEE 41st Annual Frequency Control Symposium, 1987, 371-381) and vertically coupled CRFs (see G. G. Fattinger, et al, "*Single-to-balanced Filters for Mobile Phones using Coupled Resonator BAW Technology*", Proc. IEEE Ultrasonics Symposium, 2004, pp. 416-419). In an SCF, two piezoelectric layers are separated by an intermediate electrode. In a vertically coupled CRF, coupling layers are used to modify the coupling strength between the piezo layers. The CRF can be fabricated either using the SMR or membrane technology.

A thin-film vertically coupled CRF has been shown to give a relatively wide-band frequency response (80 MHz at 1850 MHz center frequency, or 4.3% of center frequency (see Fattinger et al)). They also enable unbalanced-to-balanced (balun) conversion. The disadvantage of the vertically coupled CRFs is the need for a large number of layers and their sensitivity to the thickness of the piezolayers. This makes the fabrication process difficult and consequently expensive.

Lateral acoustic coupling in bulk acoustic waves thin-film devices (LBAW) is a promising technology for filter fabrication, which however has not been extensively studied. It can, however, be demonstrated that TE1 mode LBAW filter performance is comparable or superior to that of the current commercially available acoustic-wave filters. However, a strong spurious response is visible below the filter passband (formed by the TE1 mode). The spurious peak is due to the excitation of a strong second-order thickness-shear (TS2) wave vibration mode. To render the prototype filter commercially viable, this response must be suppressed.

In more detail and in contrast with vertical acoustic coupling lateral acoustical coupling in BAW can be realized with 2 or more narrow resonators (width W on the order of piezoelectric layer thickness d) formed by electrodes placed close to each other on the piezoelectric layer. FIG. 4a is a schematic picture of a 2-electrode LBAW 40 fabricated on a Bragg reflector 45 (solidly mounted resonator type, SMR). The reflector 45 isolates the resonators from the substrate 46, preventing leakage of acoustic energy into the substrate and thereby reducing losses. The piezoactive wave guide portion is denoted with the reference numeral 43 and the electrodes are shown as parts 41, 42 and 44.

Electrical input signal in Port 1 is transformed into mechanical vibration via the piezoelectric effect. This vibration couples mechanically across the gap to Port 2 and creates an output electrical signal. Electrodes in the example of FIG. 4b are interdigital (comb-like), but other shapes are possible as well. Coupling strength is determined by the acoustic properties of the structure and by the gap between the electrodes.

In a simplified picture, bandpass frequency response is formed by two lateral standing wave resonances arising in the LBAW structure, as illustrated in FIGS. 5a and 5b for a two-electrode structure. In the even mode resonance, both electrodes vibrate in-phase, whereas in the odd resonance their phases are opposite. For a resonator operating at the TE1 mode, the even mode resonance, having a longer wavelength, is lower in the frequency than the shorter-wavelength odd mode resonance. The frequency difference between the standing wave resonances determines the achievable bandwidth of the filter, and depends on the acoustic properties of the structure and on the electrode dimensions.

The main general advantage of the LBAW over the vertical CRF is the simple fabrication technology, as only one piezoelectric layer and no coupling layers are required. Operation at high frequencies is easier than for Surface Acoustic Wave components, as the operation frequency is mainly determined by the layer thicknesses, not the electrode dimensions. Lately, it has also been shown that a wide bandwidth (3 dB bandwidth 5% at 2 GHz) is obtainable with LBAW filters, making them viable for most RF applications, see Meltaus, J. et al, "*Laterally coupled BAW filters with 5% bandwidth*" Ultrasonics Symposium (IUS), 2010 IEEE, 11-14 Oct. 2010, 966-969. This can also be seen from FIG. 6a showing a bandwidth for a CRF filter (3 dB bandwidth 4.3%) and FIG. 6b showing a wider bandwidth for an LBAW filter. As can be seen, the quality of the signal at the desired TE1 passband is also better for LBAW than for CRF.

A problem with the current responses is the spurious passband below the desired passband, arising from the thickness-shear TS2 mode. To prevent losing acoustic energy into the substrate, it is advantageous to design the reflector stack in such a way that it reflects not only the longitudinal wave but to some extent also the shear wave. Moreover, due to the lateral topology including narrow structures, there is a strong coupling of the vertical electrical excitation signal to the shear mode vibration. As a consequence, the thickness shear wave mode is efficiently excited and also couples electrically to the filter structure, producing an unwanted passband. The spurious response is clearly seen in 6b at 1790 MHz. Due to the acoustic properties of the thin-film layer stack, the TS2 passband is situated in frequency relatively close below the filter passband.

Unwanted passband suppression by reflector design has been reported previously in the context of vertically coupled BAWs, see R. Aigner et al, "*Bulk Acoustic Wave Filter and Method for Eliminating Unwanted Side Passbands*" and US 2005/0200433. Also U.S. Pat. No. 6,933,807 discusses the possibility to couple a plurality of BAW resonators (vertically) for forming a filter device with optimized passband. In these cases, the unwanted passbands are, however, relatively far away from the actual passband and not close to the filter passband as in the case of LBAW devices. Furthermore, they are principally higher harmonics of the operating mode, i.e., same (typically longitudinal) but higher-order vibration modes as the operating mode, not a different (typically shear) mode. In LBAW devices the coupling to shear vibration is stronger than in BAW CRFs, in which the lateral dimensions typically are considerably larger than in LBAWs (100 times the thickness of piezolayer in CRF, on the order of the piezolayer thickness in LBAW), and lateral fields are not prominent. Conserving the energy of shear vibration in the operation frequencies is not as critical in BAW CRFs as it is in LBAWs. Therefore, the techniques and structures used with BAW CRF cannot be used to suppress the unwanted passband arising in LBAW filters.

Thus, there is a need for improved techniques for suppressing unwanted passbands of LBAW filters.

SUMMARY OF THE INVENTION

The aim of this invention is to provide a solution for improving the quality of the passband and near-passband response of an LBAW filter.

The invention is based on the observation that despite the closeness of the unwanted spurious passband close to the desired passband, the unwanted portion can be suppressed by providing a reflector stack underneath the piezoelectric filter, the reflector stack being designed so that at the frequency of the unwanted passband, shear waves pass through the reflector, whereas in the filter passband, both shear and longitudinal waves are reflected to ensure low losses.

More specifically the laterally coupled bulk acoustic wave filter according to the invention is characterized by the features of claim 1. Preferred embodiments are characterized in the dependent claims.

In one embodiment the filter comprises,
a piezoactive vibration layer for carrying bulk acoustic waves,
electrode means coupled to the vibration layer for exciting to the vibration layer at least one longitudinal wave mode having a first frequency band and one shear wave mode having a second frequency band and
for sensing the filter pass signal, the electrode means comprising first and second electrode means laterally acoustically coupled to each other and placed on top of the vibration layer, and conductive third electrode coupled to the bottom side of the vibration layer,
an acoustic reflector structure in acoustic connection with the vibration layer, the reflector structure being adapted to acoustically isolate the vibration layer from its surroundings at the first frequency band more efficiently than at the second frequency band.

In other words, the reflectance of the reflector structure is better for acoustic modes at the first frequency band than for acoustic modes at the second frequency band.

In one embodiment, the method of filtering an electrical RF signal according to the invention comprises
providing a bulk acoustic wave resonator comprising
a single vibration layer,
first and second electrode coupled to the vibration layer and laterally acoustically coupled to each other, and
an acoustic reflector structure adapted to acoustically isolate the vibration layer from its surroundings,
so as to form a lateral bulk acoustic wave filter,
feeding the RF signal to be filtered to the first electrode for exciting acoustic waves to said vibration layer, the acoustic waves comprising at least one longitudinal wave mode having a first frequency band and one shear wave mode having a second frequency band,
suppressing the shear wave mode at the second frequency band by allowing it to pass the acoustic reflector structure at least partly,
keeping the longitudinal wave mode and the shear wave mode at the first frequency band essentially in the vibration layer by reflecting it from the acoustic reflector structure,
reading the filter pass signal using the second electrode.

According to one embodiment, in the electrical frequency response (insertion loss) the second frequency band is suppressed by at least 6, in particular at least 10 dB compared to the first frequency band.

According to one embodiment, the reflector structure comprises an asymmetric multilayer structure in which the layer thicknesses and acoustic impedances are adapted to exhibit different acoustic properties in a first zone close to the vibration layer and in a second zone farther from the vibration layer.

According to one embodiment, the reflector structure is located below a bottom electrode layer such that the topmost layer thereof (typically made of $SiO_2$) is in contact with the bottom electrode layer. The bottom electrode layer may be continuous or patterned.

The reflector structure is preferably a layered structure with five or more stacked distinguishable layers of at least two different materials having different acoustic impedances. Typically, the layers of different materials are alternatingly ordered.

The reflector structure and/or the resonator structure, or their interface, may also contain one or more additional layers, such as adhesion layers.

According to one embodiment, at least some of the layer thicknesses of the reflector structure are different from those of an ideal acoustic Bragg reflector (longitudinal quarter wave reflector), in which the different material layers alternate the layers having the same acoustic impedance are of the same thickness. Thicknesses t of the layers of a "longitudinal quarter wave reflector" as herein used satisfy the following equation;

$$t = \lambda/4 = v_{longitudinal}/(4f_0)$$

wherein the operation frequency is $f_0$, $v_{longitudinal}$ is characteristic of each material in the reflector, and at $f_0$ the longitudinal bulk wave velocity is given by $\lambda = v_{longitudinal}/f_0$.

According to one embodiment, the first and second frequency bands partly overlap and the reflector structure is adapted to provide said suppression of the effect of the shear wave essentially only at the non-overlapping range thereof.

In particular, in the present structure, the layers below the topmost layer of the reflector can be modified such that the shear wave is not efficiently reflected at the second frequency band (i.e., at TS2 resonance frequencies and around it) but at the same time, the shear wave is efficiently reflected at the filter passband (i.e. TE1 resonance frequency) to ensure low losses. The topmost layer, on the other hand, can be modified to alter the dispersion properties of the reflector structure. More detailed design principles and examples are presented later.

According to another embodiment, the desired frequency-dependent reflector effect is achieved by selecting the acoustic materials of the various layers of the reflector structure from a group of more than two materials instead of or in addition to adjusting the layer thicknesses.

The dispersion properties of the device and in particular of the reflector structure are designed in such way that filter operation is possible, i.e., energy trapping in the electrodes within the filter passband takes place and the structure preferably exhibits Type 1 dispersion with efficient longitudinal wave reflection. However, it is possible to design also structures exhibiting Type 2 dispersion.

The vibration layer is typically a piezoactive layer. The thicknesses of the piezo layer and the electrode layers on opposing sides thereof are modified so that energy trapping in the structure and desired resonance frequency are achieved.

The invention provides considerable advantages, the most important of which is that it makes LBAW filter more suitable for commercial RF applications due to improved passband characteristics. It has been demonstrated that in spite of the closeness of the spurious and filter passbands, by re-designing the reflector such that at the shear-wave passband frequencies, spurious shear waves pass through the reflector, while at filter passband, both longitudinal and shear waves are reflected, the unwanted passband was suppressed by 8 dB. At the same time, losses at filter passband were not significantly increased, which is a basic requirement for efficient operation of the filter. This implies a great improvement in passband quality. By further optimization, suppression of more than 10 dB can be expected.

Compared with vertically coupled BAW filters, the present structure allows for significant reduction of the number of layers needed. In particular, only one piezoactive main vibration layer and less electrode layers are needed. Consequently, the invention also relieves the manufacturing tolerance of the thickness of the piezoactive main vibration layer (as no coupling between a plurality of such layers is needed).

Next, embodiments of the invention and advantages thereof are described more closely with reference to the attached drawings.

DETAILED DESCRIPTION OF EMBODIMENTS

Figure 1:
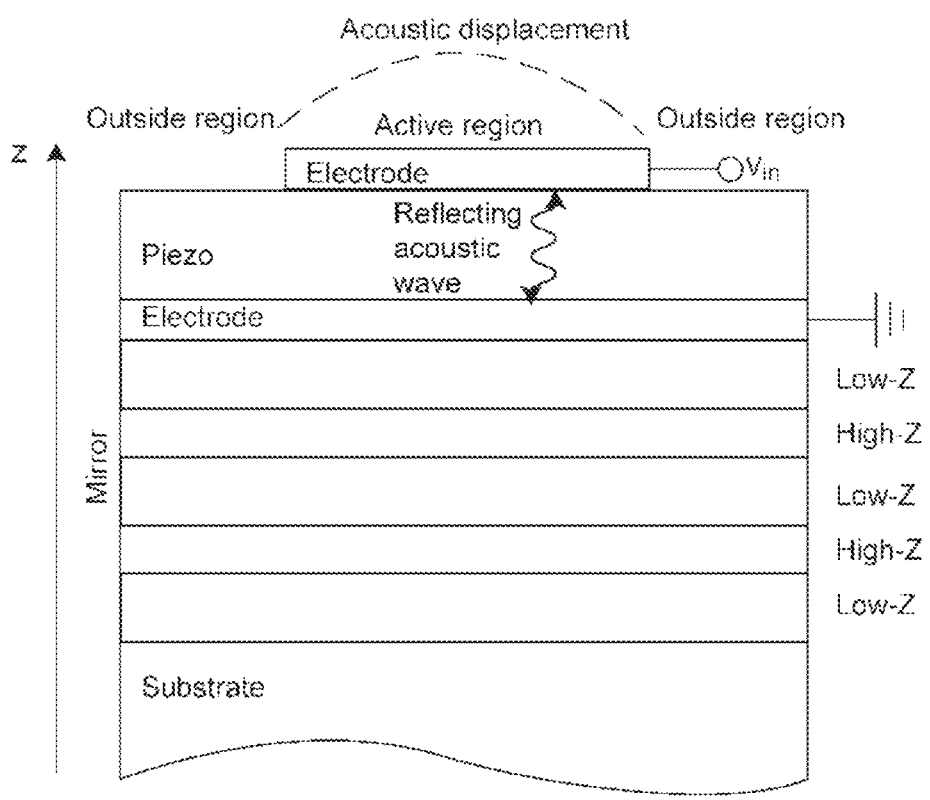
FIG. 1: Schematic picture of a solidly-mounted piezoelectric BAW resonator based on thin-film technology.
Figure 2:
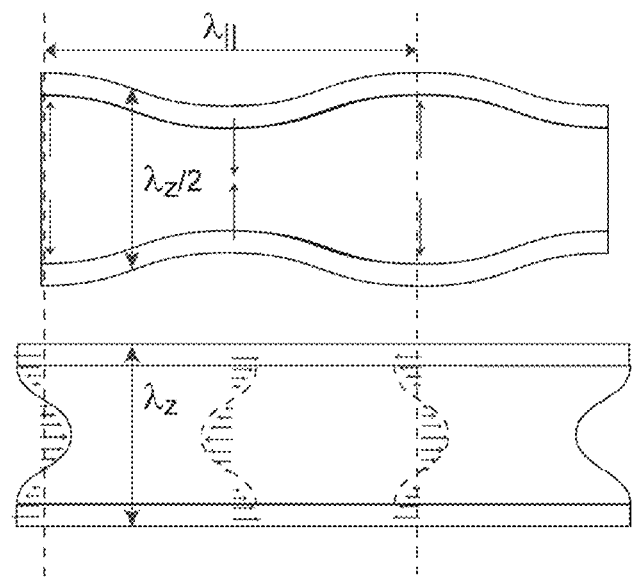
FIG. 2: Schematic side view illustrating TE1 and TS2 plate wave modes in a BAW resonator.
Figure 3:
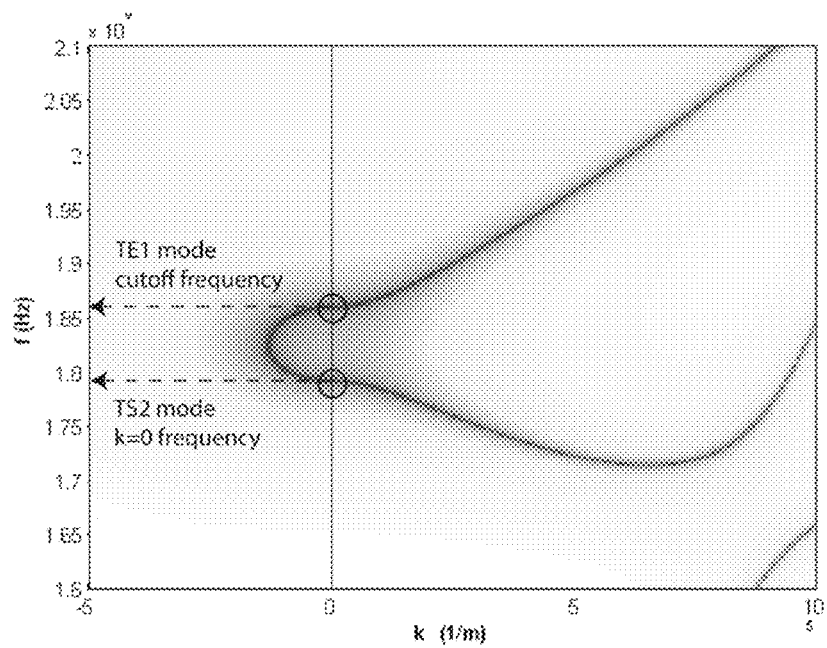
FIG. 3: Dispersion diagram showing the lateral wave number $k_\parallel = 2\pi/\lambda_\parallel$ of a plate wave mode vs. the excitation frequency f.
Figure 4A:
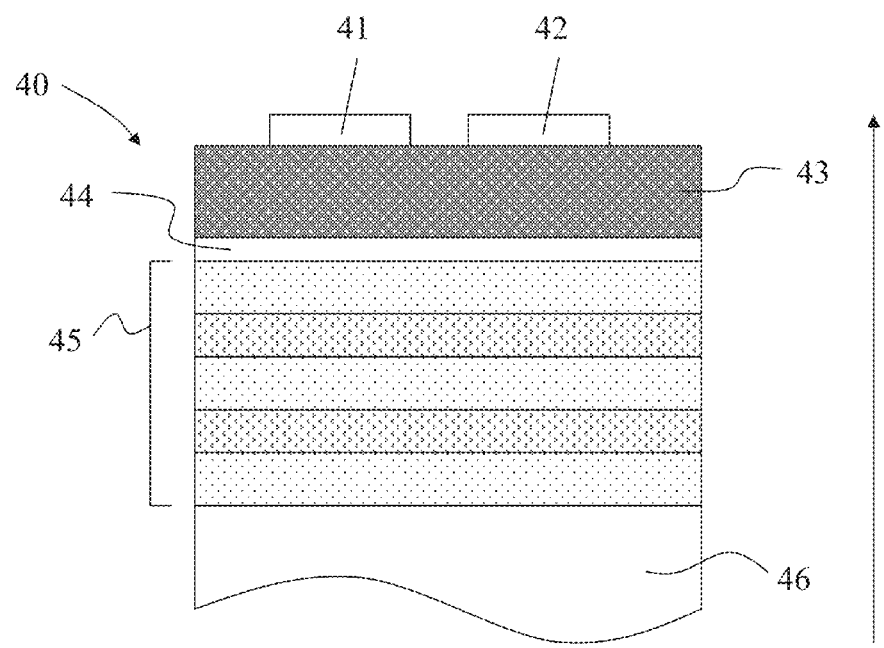
FIG. 4a: Schematic side view of a two top electrode LBAW filter with a quarter-wavelength reflector.
Figure 4B:
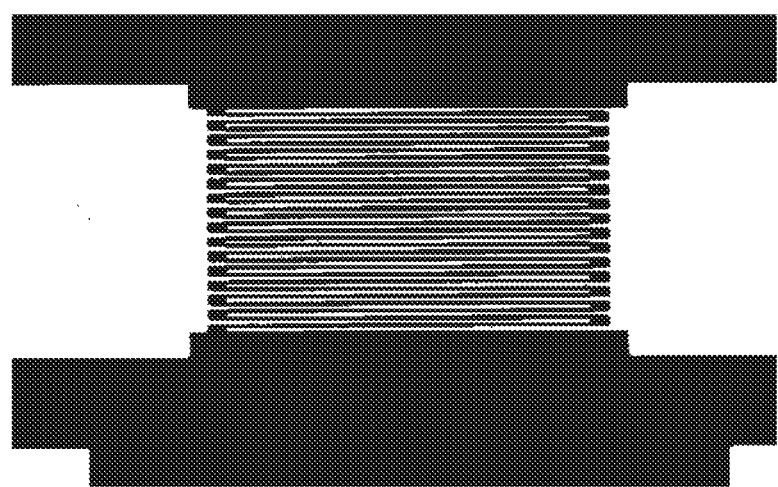
FIG. 4b: Top view of an electrode arrangement in a LBAW filter.
Figure 5A:
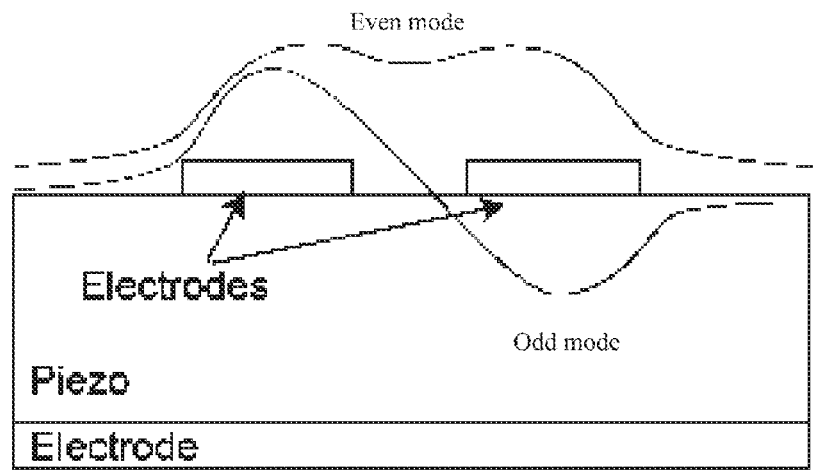
FIG. 5a: Even and odd lateral standing wave modes arising in an LBAW structure.
Figure 5B:
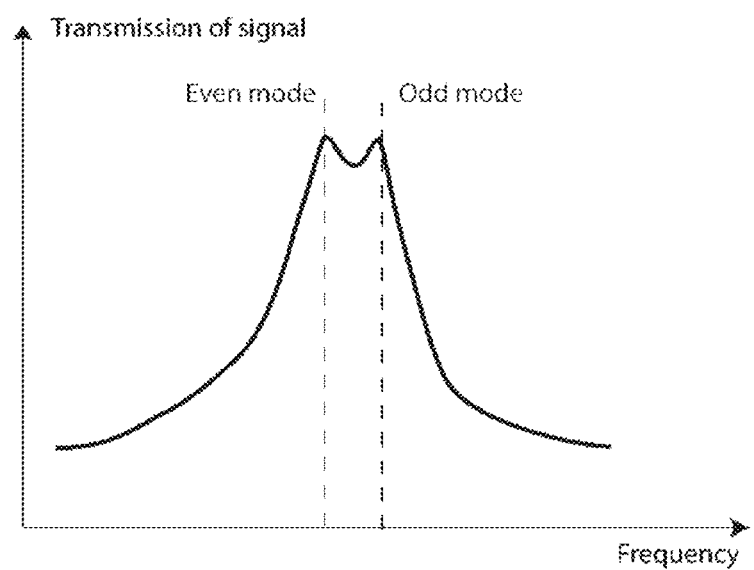
FIG. 5b: Schematic of a bandpass frequency response graph formed by two lateral standing waves arising in an LBAW structure.
Figure 6A:
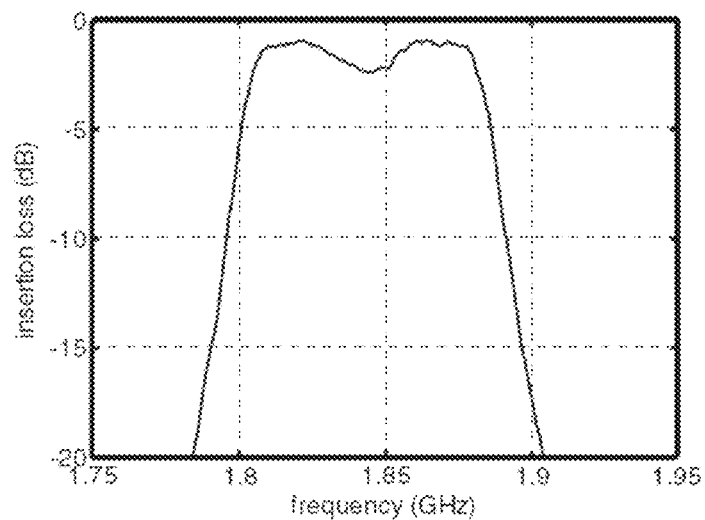
FIG. 6a: Bandwidth graph of vertically coupled CRF.
Figure 6B:
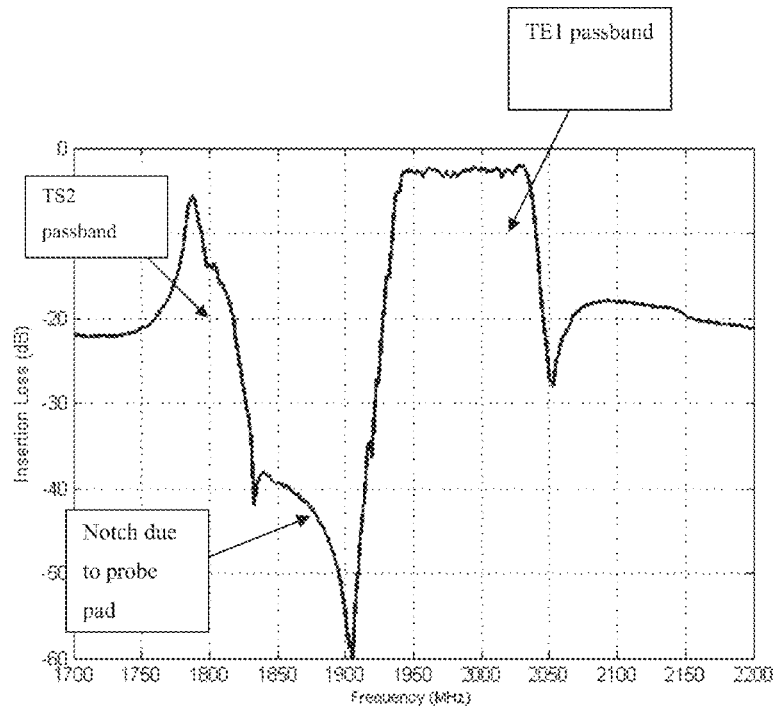
FIG. 6b: Bandwidth graph of a reference LBAW filter.
Figure 7A:
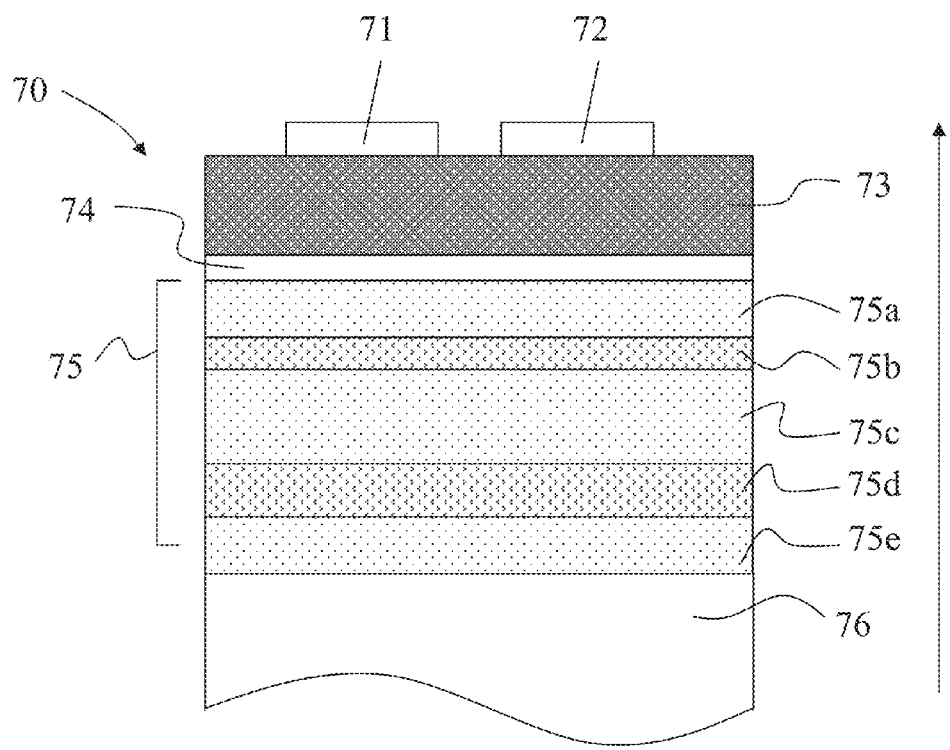
FIG. 7a: A side view of a 2-port LBAW filter with a reflector structure capable of suppressing undesired shear wave response.

FIG. 7*a* shows a filter structure according to one embodiment of the invention. The structure comprises a planar piezoactive layer 73 on a planar bottom (ground) electrode layer 74. The input and output ports or electrodes 71 and 72 are made of a patterned layer on top of the piezoactive layer 73. Below the bottom electrode 74, there is an acoustic reflector 75, which is formed of several sublayers 75*a-e*. The sublayers comprise low-impedance layers 75*a*, 75*c* and 75*e* and high-impedance layers 75*b* and 75*d* in alternating manner. Below the acoustic reflector 75 is a substrate 76 supporting the whole structure and absorbing the acoustic energy passing though the acoustic reflector 75.

In more detail, the structure according to FIG. 7 comprises, listed from top to bottom, a conductive top electrode layer patterned so as to form at least two electrodes 71 and 72,
    a piezoactive layer 73,
    a conductive bottom electrode layer 74,
    a reflector stack comprising
        a low-impedance first layer 75*a* having a first thickness,
        a high-impedance second layer 75*b* having a second thickness,
        a low-impedance third layer 75*c* having a third thickness,
        a high-impedance fourth layer 75*d* having a fourth thickness,
        a low-impedance fifth layer 75*e* having a fifth thickness,
    a substrate layer 76 supporting the whole filter 70.

The terms low-impedance and high-impedance should be understood such that the acoustic impedances of each of the low-impedance layers is not more than that of any of the high-impedance layers. The low- and high-impedance layers are typically made of different materials. Within each of these groups, the materials and thus the acoustic impedances of each of the layers in the group are typically mutually the same but may, however, also be mutually different.

In contrast to prior art LBAW filters, the thicknesses of the sublayers 75*a-e* of the acoustic reflector 75 are adjusted so as to selectively pass or reflect the frequencies of the passbands of different modes arising in the vibration layer 73. There are some general rules that may be used alone or in combination to design such a reflector structure:

A quarter-wavelength reflector at the desired operation frequency (e.g., filter center frequency) can be taken as the starting point of the design. That is, at the desired operation frequency, the reflector layer thicknesses are one fourth of the acoustic wavelength of the used acoustic wave type (e.g., longitudinal bulk wave) in the material at that frequency.

Depending on the piezoelectric material used and the vibration mode to be used, it may be necessary to adjust the layer thicknesses so that the desired dispersion characteristics are obtained. For example, when using piezoelectric AlN, which intrinsically has Type 2 dispersion, it may be desirable to obtain dispersion type for which the second-order thickness-shear mode (TS2) is lower in frequency than the TE1 mode. For a W/SiO2 reflector, this typically means increasing the thickness of the topmost SiO2 layer.

To ensure low losses, shear wave reflection within the filter passband is desirable. To that end, layer thicknesses (including the vibration layer and electrode layers) can be adjusted. Typically this means decreasing thicknesses of reflector layers from their quarter-wavelength values.

After determining the resonance frequency or frequencies of the unwanted vibration mode (e.g., TS2), which form the unwanted passband response, the layer thicknesses are adjusted so that the reflectance of the reflector for the undesired vibration around those frequencies is reduced, while the desired dispersion type and low losses at filter passband are retained. To that end, the resonator layers (vibration layer and electrodes) and the reflector layers closest to the resonator are modified as little as possible, preferably not at all. If necessary, they are modified towards, but not over, their quarter-wavelength values at the frequency of the undesired response. This ensures that the filter operation stays close to optimal.

The reflector layers below the topmost reflector layer are modified towards, and if necessary, over their quarter-wavelength values at the frequency of the undesired response. This ensures that the undesired shear wave frequencies pass the reflector.

Following the general rules given above, several practical embodiments can be described.

According to one embodiment, the stack comprises at least two high acoustic impedance layers, of which the one farther from the vibration layer is thicker that the one closer to the vibration layer.

According to one embodiment, the stack comprises at least three low acoustic impedance layers, the outermost of which are not thicker than any of the low acoustic impedance layers between the outermost.

In a typical embodiment, the reflector layer closest to the vibration layer has a larger thickness than that of a corresponding layer of a longitudinal quarter-wavelength reflector structure having the same number of layers and at the frequency of the unwanted response and at least one of the rest of the reflector layers have a smaller thickness their corresponding layers. In one embodiment, only the layer below the topmost reflector layer (i.e., second reflector layer from top) has a smaller thickness than its corresponding layers in a longitudinal quarter-wavelength reflector structure. The other layers have the same or larger thickness.

For example, in a five-layer reflector structure, compared with longitudinal quarter-wavelength reflector structure at the frequency of the unwanted response may be the following:
        The first layer 75*a* (topmost layer) has a larger thickness.
        The second layer 75*b* has a smaller thickness.
        The third layer 75*c* has a larger thickness.
        The fourth layer 75*d* has a larger thickness.
        The fifth layer 75*e* has a larger thickness.

To give a more concrete example, the relative thicknesses of the various layers from top to bottom are within the following ranges (the relative thickness of the piezoactive layer being 1800 units):
    low-impedance first layer: 900-1200, in particular 950-1050,
    high-impedance second layer: 500-700, in particular 520-580,
    low-impedance third layer: 900-1400, in particular 1000-1300, high-impedance fourth layer: 750-1000, in particular 800-900, low-impedance fifth layer: 850-1100, in particular 900-1000.

According to one embodiment, the units referred to above are nanometers. Thicknesses of corresponding longitudinal quarter-wavelength reflector layers are given below in section "Simulation example".

Figure 7B:
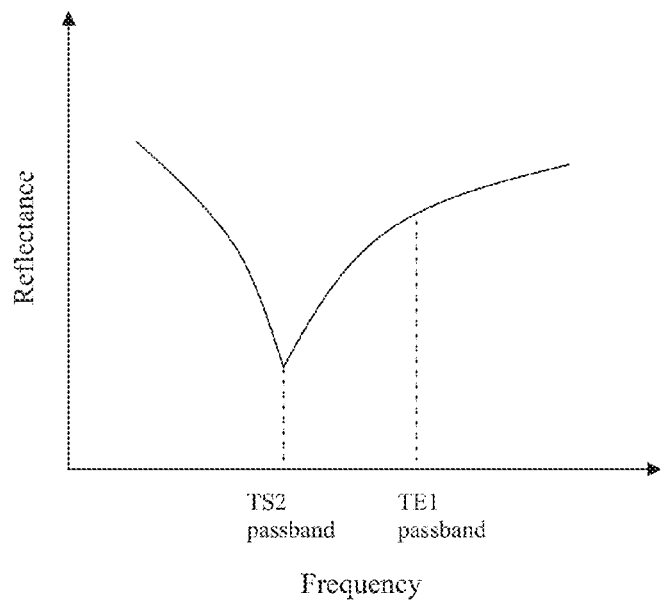
FIG. 7b: Schematic of an acoustic reflector TS2 reflectance vs. frequency of a reflector structure capable of suppressing undesired shear wave response.
Figure 8A:
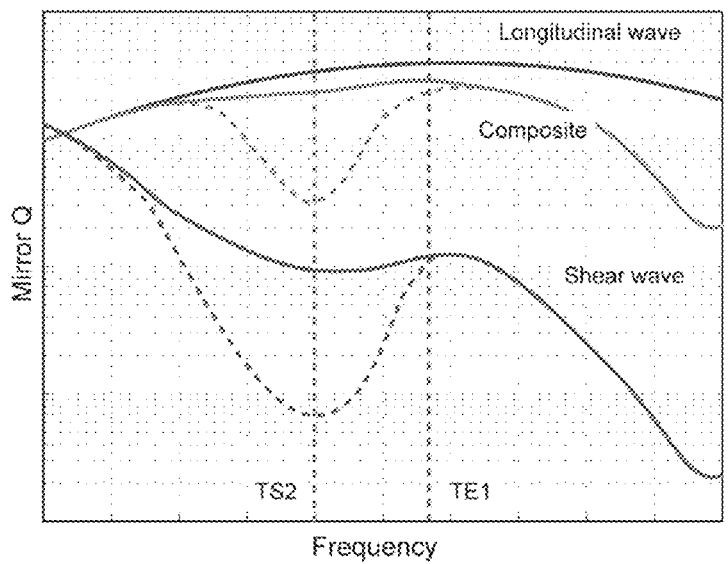
FIG. 8a: Schematic illustration of suppressing the TS2 passband in an LBAW filter by modifying the reflector stack, whereby the quality factor quality factor $Q = 1/(1-|r|^2)$, r=reflectance, for the shear wave at TS2 resonance frequency is reduced (dashed lines), while the reflectance for the longitudinal wave stays the same. Composite value is calculated assuming 1% of acoustic energy to be in the shear vibration.
Figure 8B:
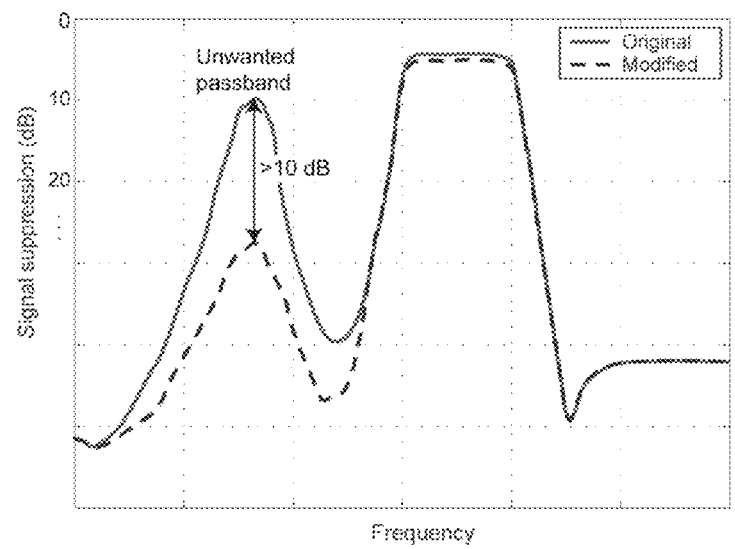
FIG. 8b: Schematic frequency response graph illustrating the suppression of the unwanted TS2 passband.

The schematic shape of reflectance vs. frequency for shear waves of the reflector structure according to FIG. 7a is shown in FIG. 7b. As can be seen, there is a significant notch at the frequency of the TS2 passband, causing the exclusive suppression of the spurious response.

Figure 10A:
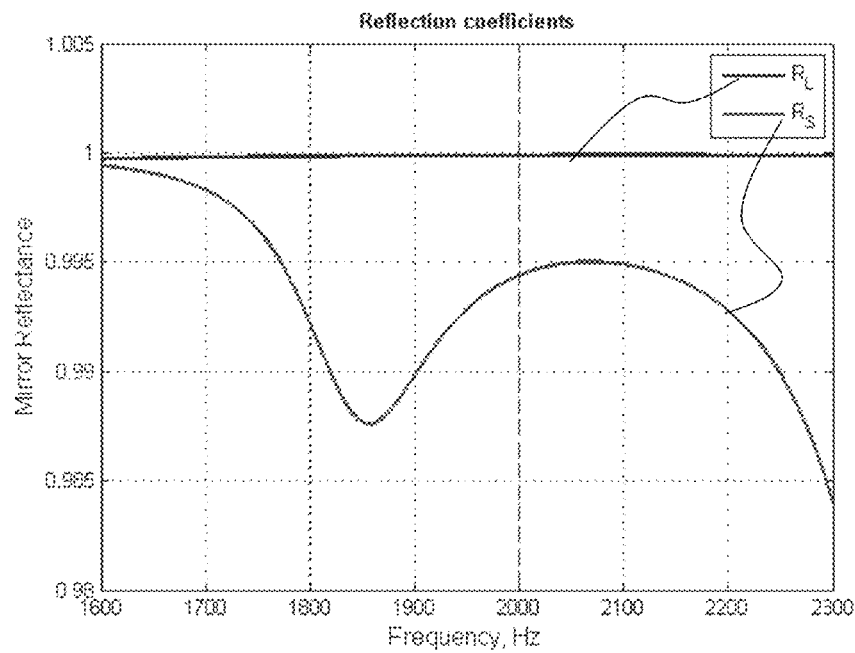
FIG. 10a: 1D simulations of reflector reflectance in the non-modified LBAW stack. Solid curve: longitudinal wave, dashed curve: shear wave.
Figure 10B:
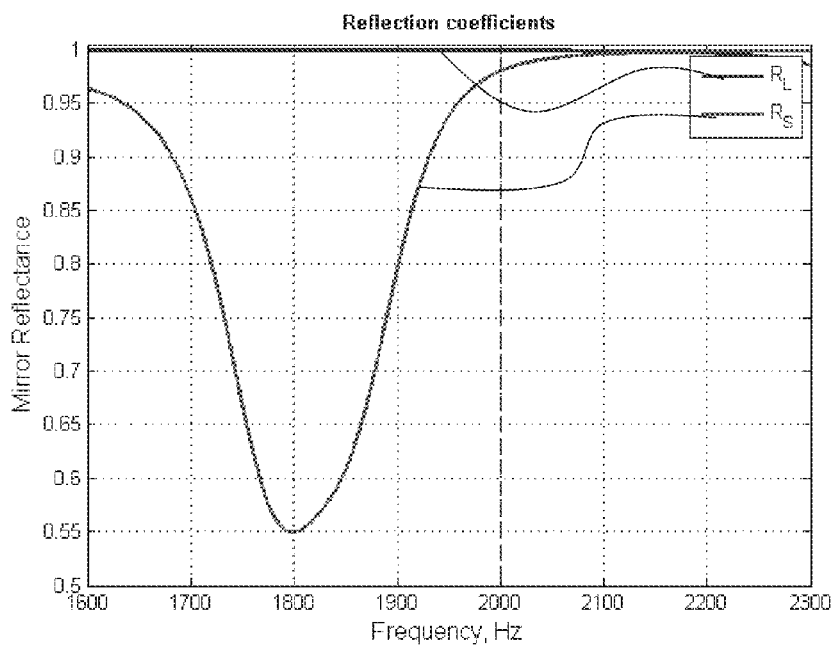
FIG. 10*b*: 1D simulations of reflector reflectance in the modified stack. Solid curve: longitudinal wave, dashed curve: shear wave.
Figure 11:
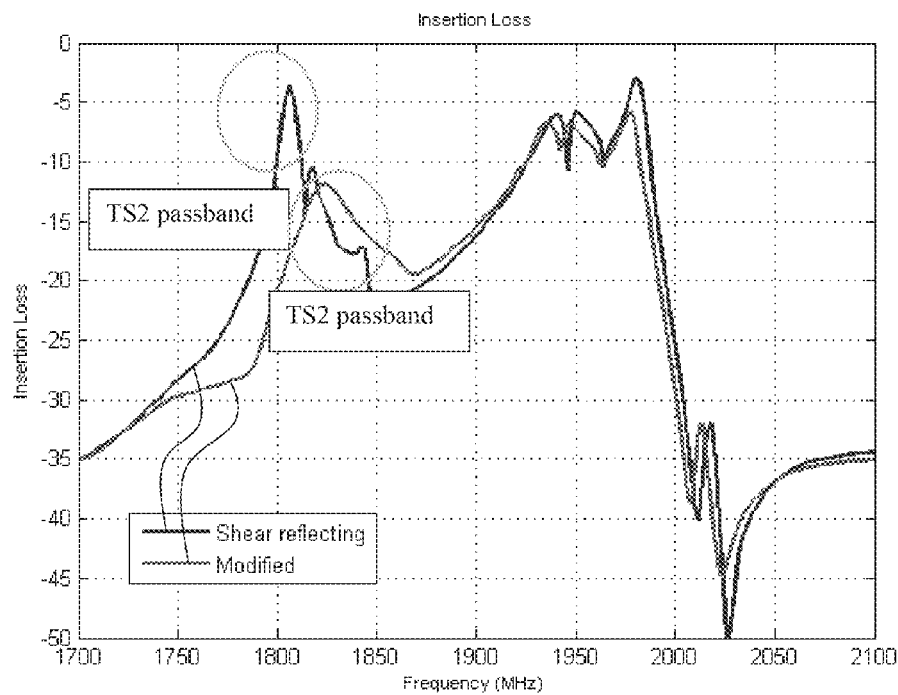
FIG. 11: Signal transmission (electrical frequency response) calculated by FEM simulation for the non-modified stack (solid curve) and modified stack (dashed curve) (the unwanted TS2 passband in the modified stack has been suppressed by 8 dB).

As will be shown later with the aid of simulations, this kind of behaviour is possible to achieve in practice (FIGS. 10a and 10b).

According to one embodiment, the electrodes 71, 72 comprise two local or patterned electrodes on top of the vibration layer and there is additionally one planar electrode layer below the vibration layer. In particular, the electrodes 72, 72 can be arranged in interdigital (comb-like) configuration on top of the vibration layer so as to form an interdigital transducer (IDT).

Instead of being a planar continuous electrode layer, as shown in FIG. 7a, the bottom electrode layer may also be patterned to form at least two electrodes. According to one embodiment, the bottom electrode layer comprises two electrode portions (not shown) arranged in interdigital configuration. According to one embodiment, both the top and bottom electrodes are adapted to be interdigital transducers so as to form a four-electrode filter. Preferably, the top and bottom electrodes have the same geometry, in particular the same interdigital geometry.

If there are two electrodes both at the top and bottom of the piezoactive layer, a simple balanced-unbalanced (balun) signal conversion can be achieved in the filter (also referred to as differential-single-ended conversion). Many present radio devices utilize a separate balun components. The present LBAW filter with the TS2 suppressing reflector structure has shown to be compatible with balun conversion in a single component, which makes the invention even more attractive for practical applications.

The electrodes and the stack are designed to trap the desired wave modes of the vibration layer at the desired passband frequency of the filter.

It should be noted that the reflector stack is preferably designed to reflect not only the longitudinal wave, which is the prominent wave mode within the filter passband, but also the shear wave, which is present to a smaller extent also in the thickness-extensional mode in order to maximize the output signal of the filter. Thus, the reflector stack is designed so that it reflects well both the longitudinal and shear wave in the passband, but transmit the shear wave at and around the onset of the TS2 mode, in order to suppress the unwanted passband response.

Potential materials for the different layers of the filter include:

Top electrode(s): Al, Mo
Piezoactive layer: AlN, ZnO, ScAlN, LiNbO3
Bottom electrode(s): Mo, Al, Pt
Low-Z reflector material: $SiO_2$
High-Z reflector material: W, Mo, AlN, ZnO, $Si_3N_4$, $Ta_2O_5$
Substrate: Si, glass, quartz, sapphire There are, however, a selection of other possible materials available for each of the layers.

According to one embodiment, the adjusted stack is designed also to retain other properties that make even lower-loss filter operation possible: Type 1 dispersion, energy trapping within the filter structure (evanescent wave outside the filter), and sufficiently high electro-mechanical coupling coefficient. It is also advantageous to have the TS2 mode as far away in frequency as possible from the TE1 mode. However, typically the peak of the TS2 mode is within 15% of the desired operation frequency of the filter whereby very careful adjustment of the reflector is needed according to the above principles.

Simulation Example

In the following, the feasibility of the invention is illustrated with help of two reflector and resonator layer stack designs. The first one (referred to as the non-modified stack) is designed to efficiently reflect both longitudinal and shear waves and has a strong TS2 response.

The non-modified stack is then modified to obtain the above-described functionality. This stack is used to illustrate the current invention.

In Table 1, layer materials and thicknesses for the original (non-modified) reflector and resonator stack and the modified stack are given from bottom to top. For reference, the quarter-wavelength thicknesses of reflector layers at 1800 MHz (close to the onset frequency of the TS2 curve) are also given.

TABLE 1

Layer thicknesses (nm) in the simulated stacks, from bottom to top. Thicknesses of quarter-wavelength reflector for a longitudinal wave at the TS2 onset frequency (1800 MHz) are also given for the reflector layers.

|  | SiO2_3 | W2 | SiO2_1 | W1 | SiO2_1 | Mo | AlN | Al |
|---|---|---|---|---|---|---|---|---|
| Shear-reflecting | 790 | 505 | 620 | 510 | 1017 | 300 | 1800 | 100 |
| Longitudinal Quarter-wave @TS2 onset | 830 | 726 | 830 | 726 | 830 | — | — | — |
| Change, % | +5 | +44 | +34 | +42 | −22 | — | — | — |
| Modified | 1000 | 860 | 1170 | 520 | 1017 | 300 | 1800 | 100 |
| Change, % | +27 | +70 | +89 | +2 | 0 | 0 | 0 | 0 |

It should be noted that the layer materials can be others than those used in this example.

As can be seen, in the modified stack, the reflector layers closest to the resonator (W1 and SiO2_1) are modified not at all or only slightly from the shear-reflecting thickness towards the quarter-wavelength thickness. The layers below that (SiO2_2, W2, SiO2_3), on the other hand, are changed even more than the quarter-wavelength stack would require. To retain the properties necessary for filter operation, the resonator layers (piezoelectric vibration layer and electrode layers) may need to be modified as well.

Dispersion Properties

Figure 9A:
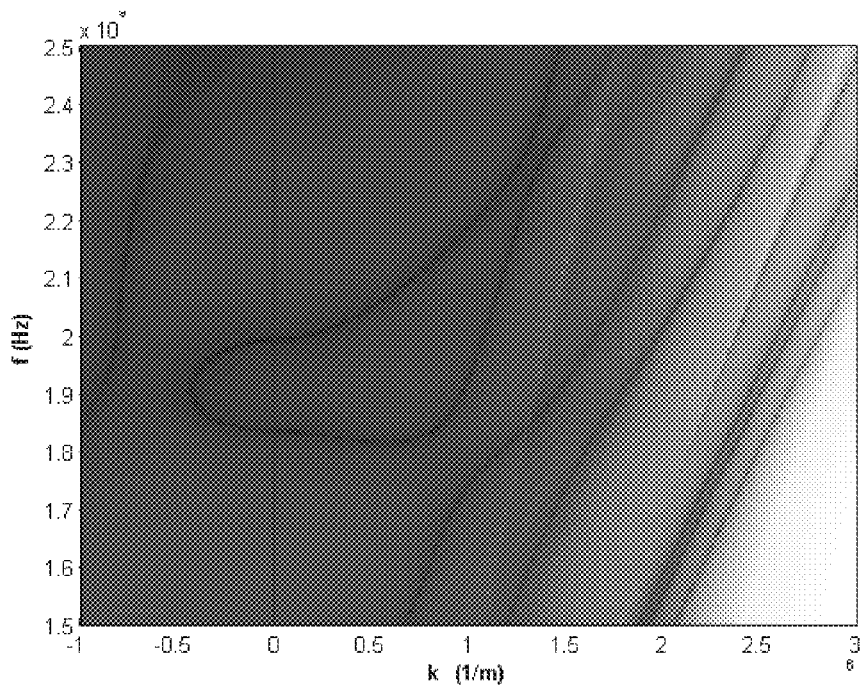
FIG. 9a: Simulated dispersion diagram of the metallized region of an LBAW stack (TS2 onset frequency is ~1800 MHz and TE1 onset at ~1990 MHz).
Figure 9B:
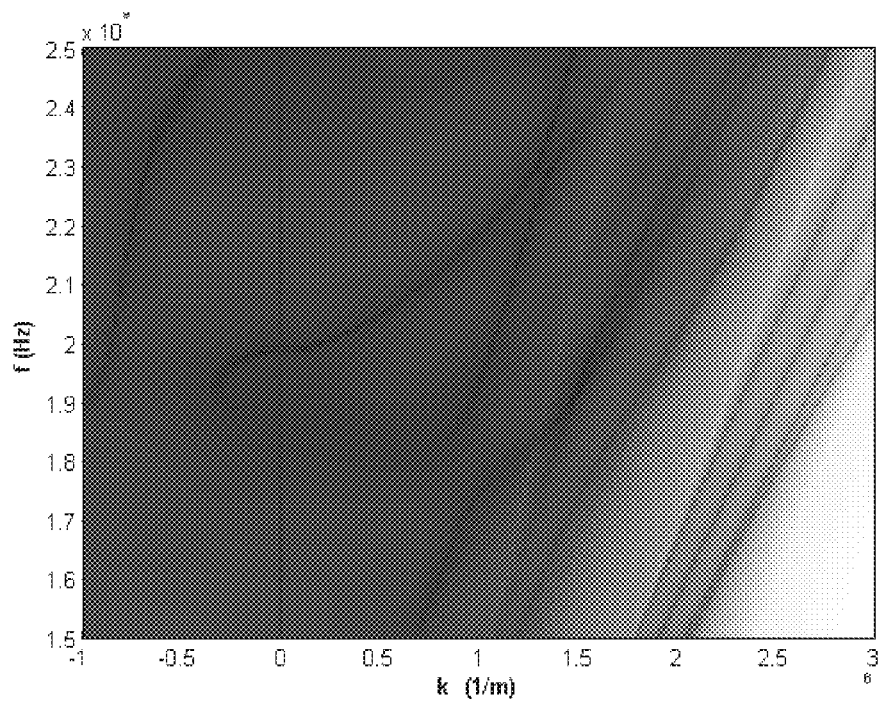
FIG. 9b: Simulated dispersion diagram of the metallized region of the modified LBAW stack (TS2 curve is very weak, indicating a lossy wave mode, TE1 onset frequency is at ~1990 MHz).

Calculated dispersion properties for metallized regions in both stacks are shown in FIGS. 9a-9b (see Brief Description of the Drawings). Positive x-axis denotes real wave numbers (propagating wave), and negative x-axis denotes imaginary wave number (evanescent wave). A sharp curve means that the wave mode is purely propagating or evanescent, a fuzzy curve indicates a complex wave number/lossy wave mode.

The dispersion of the metallized (electrode) region of the non-modified LBAW example stack (FIG. 9a) shows that the frequency difference between the TS2 and the TE1 modes' k=0 frequencies is ~160 MHz, with the TE1 mode starting at 1990 MHz and the TS2 mode at 1830 MHz.

In the electrode regions of the modified example stack (FIG. 9b), TE1 mode starts at 1990 MHz, and the k=0 frequency for the TS2 curve is 1830 MHz. The dispersion curves are therefore not significantly shifted in frequency compared to the non-modified stack. The curve for TS2 mode is not very distinctive, indicating that the wave mode is very lossy.

Reflector Reflectance

Simulated reflector reflectance for the non-modified and modified stacks are plotted in 10a and 10b. In the non-modified stack, reflectance for longitudinal waves (solid curve) is close to 1, and for shear waves (dashed curve) close to 0.995 at the TE1 resonance frequency (1990 MHz, indicated by a dashed vertical line). At the onset frequency of the TS2 mode (1800 MHz, indicated by a dashed vertical line), the reflectance of shear waves is also high (0.992 in linear scale).

In the modified stack, reflectance for longitudinal waves is close to 1 at both the TE1 and TS2 onset frequencies (1990 MHz and 1800 MHz, indicated by dashed vertical lines). For the shear waves, there is a significant reduction in reflectance around the onset frequency of the TS2 mode (1800 MHz, indicated by a dashed vertical line), with reflectance around 0.55. Notice the different y-axis scales in the figures.

Displacement Fields

The displacement field distributions of the shear wave in the layer stacks can be studied e.g. by simulations. Generally, in the non-modified stack, the displacement amplitude in the topmost SiO2 layer is very high, and lower deeper in the stack. In the modified stack, the displacement amplitude is comparable throughout the reflector. This indicates that in the modified stack, the shear vibration passes through the acoustic reflector and is not efficiently reflected.

FEM Simulations

The 1D model does not take into account the longitudinal ad shear waves simultaneously. To simulate the effects in more detail, COMSOL Multiphysics FEM solver was used.

11 shows calculated (FEM) signal transmission (electric frequency response) for the non-modified (solid curve) and modified (dashed curve) stacks. The TS2 response (seen below the filter passband, slightly above 1800 MHz) in the modified stack is suppressed by 8 dB compared to the non-modified stack. The filter passband loss level remains the same.

The invention claimed is:

1. Laterally coupled bulk acoustic wave filter comprising,
a vibration layer for carrying bulk acoustic waves,
electrode means comprising a first electrode coupled to the vibration layer for exciting to the vibration layer at least one longitudinal wave mode having a first frequency band and one shear wave mode having a second frequency band, and a second electrode coupled to the vibration layer for sensing the filter pass signal, the first and second electrodes being laterally arranged with respect to each other,
an acoustic reflector structure in acoustic connection with the vibration layer,
the reflector structure comprising a stack of acoustic impedance layers,
wherein
the thickness of the topmost layer of the stack closest to the vibration layer is larger than the calculatory layer thickness of a corresponding layer in a quarter-wave longitudinal reflector structure, whose reflectance is at its highest for the second frequency band,
the thickness of at least one of the layers of the stack below the topmost layer is smaller than the calculatory layer thickness of a corresponding layer in a quarter-wave longitudinal reflector structure, whose reflectance is at its highest for the second frequency band.

2. The filter according to claim 1, wherein the electrical frequency response of the second frequency band is suppressed by at least 6 dB compared to the first frequency band in terms of insertion loss.

3. The filter according to claim 1, wherein the reflector structure comprises an asymmetric multilayer structure in which the layer thicknesses and acoustic impedances are adapted to exhibit different acoustic properties in a first zone close to the vibration layer and in a second zone farther from the vibration layer.

4. The filter according to claim 1, wherein the reflector structure comprises a stack of at least four alternatingly ordered high and low acoustic impedance layers, the intrinsic acoustic impedance of each of the low-impedance layers being not more than that of any of the high-impedance layers.

5. The filter according to claim 4, wherein the thickness of at least half, typically all, of the layers of the stack below the topmost layer is smaller than the calculatory layer thickness of a corresponding layer in a quarter-wave longitudinal reflector structure, whose reflectance is at its highest for the second frequency band.

6. The filter according to claim 4, wherein the stack comprises at least two high acoustic impedance layers, of which the one farther from the vibration layer is thicker that the one closer to the vibration layer.

7. The filter according to claim 4, wherein the stack comprises at least three low acoustic impedance layers, the outermost of which are not thicker than any of the low acoustic impedance layers between the outermost.

8. The filter according to claim 1, wherein the vibration layer is made of piezoelectric material and the first and second electrodes are arranged on one side of the vibration layer laterally with respect to each other and the electrode means further comprise a third planar electrode arranged on the opposite side of the vibration layer.

9. The filter according to claim 1, wherein the vibration layer is made of piezoelectric material and the first and second electrodes are arranged on one side of the vibration layer and the electrode means comprise a third and fourth electrodes arranged on the opposite side of the vibration layer laterally with respect to each other.

10. The filter according to claim 1, wherein the electrode means comprise two branched electrodes arranged in interdigital configuration on one or both sides of the vibration layer.

11. The filter according to claim 1, wherein the longitudinal wave mode is the first-order thickness-extensional (TE1) mode and the shear wave mode is the second-order thickness-shear mode (TS2).

12. The filter according to claim 1, wherein the frequency of the shear wave mode deviates by not more than 15% from the frequency of the longitudinal wave mode.

13. The filter according to claim 1, comprising, listed from top to bottom, but not excluding any intermediate layers,
a conductive first electrode layer patterned so as to form at least two electrodes, a piezoactive layer,
a conductive second electrode layer,
a low-impedance first layer having a first thickness,
a high-impedance second layer having a second thickness,
a low-impedance third layer having a third thickness,
a high-impedance fourth layer having a fourth thickness,
a low-impedance fifth layer having a fifth thickness,
a substrate layer supporting the whole filter,
and wherein the intrinsic acoustic impedance of each of the low-impedance layers is not more than that of any of the high-impedance layers.

14. The filter according to claim 13, wherein the relative thicknesses of the various layers are within the following ranges, the relative thickness of the piezoactive layer being 1800 units:
low-impedance first layer: 900-1200,
high-impedance second layer: 500-700,
low-impedance third layer: 900-1400,
high-impedance fourth layer: 750-1000,
low-impedance fifth layer: 850-1100.

15. The filter according to claim 14, wherein the thickness of the vibration layer is 500-3000 nm.

16. The filter according to claim 1, wherein the first frequency band is within 0.5-5 GHz.

17. The filter according to claim 1, wherein the first and second frequency bands partly overlap and the reflector structure is adapted to provide said suppression of the effect of the shear wave essentially only at the non-overlapping range thereof.

18. The filter according to claim 1, wherein at the second frequency band shear waves pass through the reflector structure and in the first frequency band both shear and longitudinal waves are reflected from the reflector structure.

19. A method of filtering an electrical RF signal, comprising
providing a lateral bulk acoustic wave filter according to any of the preceding claims,
feeding the RF signal to be filtered to the first electrode for exciting acoustic waves to said vibration layer, the acoustic waves comprising at least one longitudinal wave mode having a first frequency band and one shear wave mode having a second frequency band,
suppressing the shear wave mode at the second frequency band by allowing it to pass the acoustic reflector structure at least partly,
keeping the longitudinal wave mode and the shear wave mode at the first frequency band essentially in the vibration layer by reflecting it from the acoustic reflector structure,
reading the filter pass signal using the second electrode.

* * * * *